United States Patent [19]

Seki et al.

[11] Patent Number: 5,016,065

[45] Date of Patent: May 14, 1991

[54] COMPOUND SEMICONDUCTOR SUBSTRATE WITH INGAP LAYER

[75] Inventors: Akinori Seki, Kitakatsuragi; Fumihiro Knoushi, Hirakata; Jun Kudo; Masayoshi Koba, both of Nara, all of Japan

[73] Assignee: Sharp Kabushiki Kaisha, Osaka, Japan

[21] Appl. No.: 430,268

[22] Filed: Nov. 2, 1989

[30] Foreign Application Priority Data

Nov. 4, 1988 [JP] Japan ............................... 63-280041

[51] Int. Cl.$^5$ ......................................... H01L 29/161
[52] U.S. Cl. .......................................... 357/16; 357/4; 357/30; 357/34; 357/22
[58] Field of Search ................. 357/16, 4, 30 E, 22 A, 357/34 HB, 34

[56] References Cited

U.S. PATENT DOCUMENTS 4,928,154  5/1990  Umeno et al. ................. 357/30 E X

FOREIGN PATENT DOCUMENTS 0291346  11/1988  European Pat. Off. .
62-238618  10/1987  Japan .
64-53407   3/1989  Japan .

OTHER PUBLICATIONS

Kondo et al., "660 nm $In_{0.5}Ga_{0.5}P$ Light-Emitting Diodes on Si Substrates", *Appl. Phys. Lett.*, 53(4), 25 Jul. 1988, pp. 279-281.
Chyi et al., "Molecular Beam Epitaxial Growth and Characterization of InSb on Si", *Appl. Phys, Lett.*, 54(11), 13 Mar. 1989, pp. 1016-1018.
"High-Quality GaInAsP/InP Heterostructures Grown by Metalorganic Chemical Vapor Deposition on Silicon Substrates", *Appl. Phys. Lett.*, 52(3), 18 Jan. 1988, pp. 209-211.
Razeghi et al., "First Room-Temperature CW Operation of a GaInAsP/InP Light-Emitting Diode on A Silicon Substrate", *Appl. Phys. Lett.*, 53(10), 5 Sep. 1988, pp. 854-856.
Seki et al., "Epitaxial Growth of InP . . . ", *J. of Crystal Growth*, vol. 93, Nos. 1-4, 1988, pp. 527-531.
van der Ziel et al., "Optically Pumped Laser . . . ", *Appl. Phys. Ltrs.*, vol. 48, No. 7, Feb. 1986, pp. 454-456.
R. Fischer et al., *Appl. Phys. Lett.*, 48 (18), 5 May 1986, pp. 1223-1225.
R. P. Gale et al., *IEEE Electron Device Lett.*, vol. ED-L-2, No. 7, Jul. 1981, pp. 169-171.
Seki et al., *Jpn. J. Appl. Phys. Lett.*, 26, No. 10, Oct. 1987, pp. 1587-1589.

*Primary Examiner*—William Mintel
*Attorney, Agent, or Firm*—Birch, Stewart, Kolasch & Birch

[57] ABSTRACT

Disclosed is a compound semiconductor substrate having a III-V group compound semiconductor layer on a IV group substrate, which has substantially no residual stress and few crystalline defects. The substrate is formed from (a) a IV group substrate, (b) a first III-V group compound semiconductor layer formed on the substrate, (c) a second compound semiconductor layer having such a lattice constant as to produce a stress in a direction opposite to the stress which occurs during the time of forming said first semiconductor layer due to a difference of thermal expansion coefficient between said substrate and said first semiconductor layer, formed on said first semiconductor layer, and (d) a third III-IV group compound semiconductor layer similar to the first semiconductor layer, formed on said second semiconductor layer.

6 Claims, 2 Drawing Sheets

COMPOUND SEMICONDUCTOR SUBSTRATE WITH INGAP LAYER

FIELD OF THE INVENTION

The present invention relates to a compound semiconductor substrate which comprises a IV group substrate and a III-V group compound semiconductor layer formed thereon. The substrate exhibits reduced residual stress and high quality.

BACKGOUND OF THE INVENTION

Techniques of growing the thin crystal of a compound semiconductor have been much developed. They are applied to the production of semiconductor lasers, solar cells and ultrahigh speed devices. These devices employ a substrate prepared from III-V group compound semiconductor. However, the substrate is expensive and fragile. Also, it is difficult to make the substrate in larger areas due to the difficulty of growing crystal. As an improved method, it is proposed that the III-V group compound semiconductor layer is formed on a IV group semiconductor substrate which is cheap and has high crystallinity. Especially, many studies have been conducted on growing this GaAs crystal on an Si substrate.

In order to grow a GaAs thin film on a Si substrate, Japanese Kokoku Publication (examined) proposes a two step method wherein GaAs is grown at a relatively low temperature and then thickened at a relatively high temperature. It is also proposed in IEEE Electron Device Lett. EDL-2.169 (1981) that a Ge intermediate layer is introduced between the Si substrate and the GaAs layer. It is further proposed that the intermediate layer can be changed with alternating layers of a GaAs layer and another III-V group compound layer having a lattice constant close to the GaAs layer. It is also proposed that a strain super lattice layer which is composed of an InGaAs layer and a GaAs layer be formed in order to obtain a GaAs layer having good quality (see Appl. Phys. Lett. 48 (1986) 1223).

The III-V group compound semiconductor includes, in addition to GaAs, InP which has good properties in peak speed of electrons and heat transfer coefficient in comparison with GaAs. The InP compound semiconductor is now intensely studied in view of possibility that it may work in higher frequencies and may produce a microwave amplifying element.

Generally, the method for growing the crystal of the III-V compound semiconductor includes a vapor phase growth method (e.g. MOCVD and Hydride VPE), a vapor deposition method (e.g. MBE etc.) and a liquid phase growth method. In these methods, a substrate is heated to an elevated temperature of at least 400° C. and a raw material is provided thereon to epitaxially grow crystal. However, where the substrate and the raw material are different in thermal expansion coefficient, the obtained epitaxial layer suffers stress due to the difference of thermal expansion coefficient after cooling. The stress causes a shift of the photoluminescent peak and warpage of the wafer. When the stress is very large, a crack of the epitaxial layer may occur resulting in a degradation of quality.

In order to obviate the above problems, the present inventors proposed in Jpn. J. Appl. Phys. Lett. 26 (1987) pp. 1587-1589 that an intermediate layer of GaAs be introduced between a Si substrate and an InP layer. In this construction, the InP epitaxial layer still has a weak tensile stress of $8.4 \times 10^8$ dyn/cm$^2$. Thus, its photoluminescent peak is shifted 1 to 5 meV to the lower side at 77° K. and changed to two peaks having a 5 to 7 meV difference. It also has a crystalline defect density (etching pit density; EPD) of 1 to $2 \times 10^8$ cm$^{-2}$ which is not sufficient for achieving good electrical properties. It therefore is required that the epitaxial layer exhibit improved crystallinity and higher quality.

SUMMARY OF THE INVENTION

The present invention provides a compound semiconductor substrate having a III-V group compound semiconductor layer on a IV group substrate, which has substantially no residual stress and few crystalline defects. The substrate of the present invention, as shown in FIG. 1, comprises;

(a) a IV group substrate 1, (b) a first III-V group compound semiconductor layer 2 formed on the substrate, (c) a second compound semiconductor layer 3 having such a lattice constant as to produce a stress in a direction opposite to the stress which occurs during the time of forming said first semiconductor layer due to a difference of thermal expansion coefficient between said substrate and said first semiconductor layer, formed on said first semiconductor layer, and (d) a third III-V group compound semiconductor layer 4 similar to the first semiconductor layer, formed on said second semiconductor layer.

DETAILED DESCRIPTION OF THE INVENTION

The IV group substrate of the present invention may be Si, Ge and the like, and preferred are Si and Ge.

The III-V group compound semiconductor for the first and third layer of the present invention may be InP, InAs, GaAs, GaP and the like. InP is preferred.

The thermal expansion coefficients of the above materials are shown in the following Table 1.

TABLE 1

| | Thermal expansion coefficient ($\times 10^{-6}$ °C$^{-1}$) |
|---|---|
| Si | 2.6 |
| Ge | 5.8 |
| InP | 4.56 |
| InAs | 5.16 |
| GaAs | 6.63 |
| GaP | 5.91 |

If the IV group substrate is Si, the thermal expansion coefficient of the III-V group compound semiconductor would be larger than the substrate of Si. Accordingly, the III-V group compound semiconductor layer, after it is formed has a residual stress in it. In the present invention, the second compound semiconductor layer should have such a lattice constant as to produce a stress in a direction opposite to the stress which occurs during the time of forming said first semiconductor layer. The second layer can be selected from GaAs, GaP, InP a mixed crystal thereof or a mixed crystal of GaAs or GaP with InP. Preferred is In$_x$Ga$_{1-x}$P ($0 < x < 1$).

According to the present invention, the lattice constant of the III-IV group compound semiconductor is 5,868 Å for InP and 5,449 –5,868 Å for In GaP.

PREFERRED EXAMPLE OF THE INVENTION

As an example, the IV group substrate is Si and the III-V group semiconductor is InP.

Figure 1:
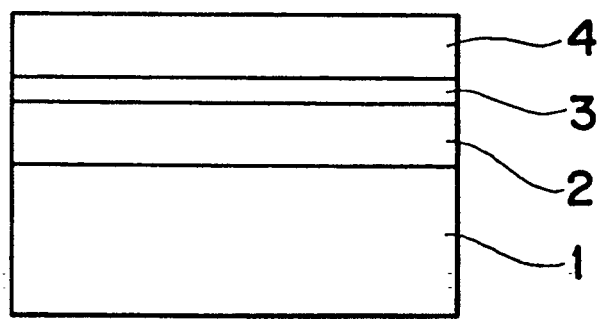
FIG. 1 schematically shows one embodiment of the substrate of the present invention.
Figure 2:
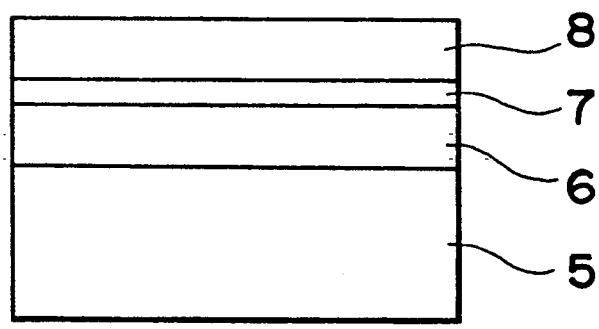
FIG. 2 schematically shows one of the compound semiconductor substrates of the present invention.

FIG. 2 schematically shows one of the compound semiconductor substrates of the present invention. An InP layer 6 is formed on the Si substrate 5 and then an $In_xGa_{1-x}P$ ($0<x<1$) 7 is formed on the InP layer 6. Another InP layer 8 is further formed on the $In_xGa_{1-x}P$ ($0<x<1$) layer 7. The $In_xGa_{1-x}P$ ($0<x<1$) layer 7 is smaller in lattice constant and produces a stress which is opposite to the stress of the InP layers 6 and 8.

Figure 3:
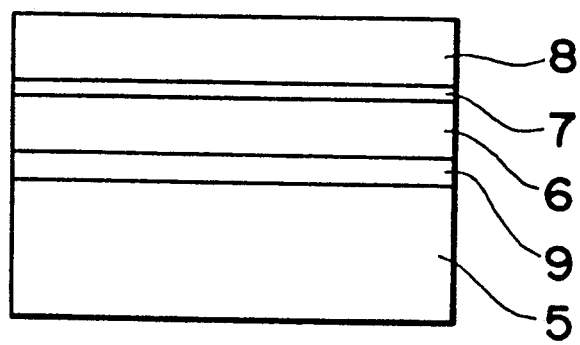
FIG. 3 schematically shows another embodiment of the present invention wherein an intermediate layer 9 of GaAs is introduced between the Si substrate and the InP layer.

FIG. 3 schematically shows another embodiment of the present invention wherein an intermediate layer 9 of GaAs is introduced between the Si substrate and the InP layer. The intermediate layer 9 lowers stress and lattice mismatch.

Figure 4:
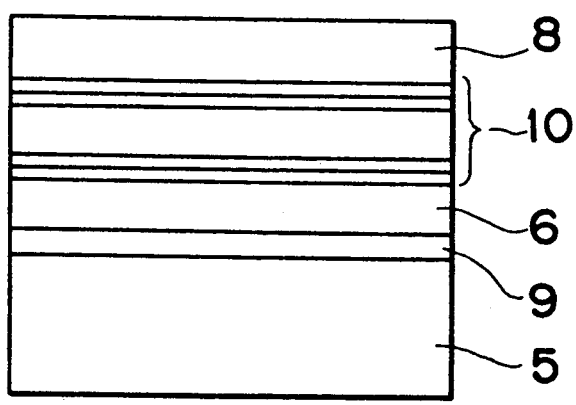
FIG. 4 schematically shows another embodiment of the present invention wherein a super lattice layer 10 of $(InP/In_xGa_{1-x}P)_n$ ($0<x<1$ and $n=2$ to 40) is employed instead of the second $In_xGa_{1-x}P$ ($0<x<1$) layer 7.

FIG. 4 schematically shows another embodiment of the present invention wherein a super lattice layer 10 of $(InP/In_xGa_{1-x}P)_n$ ($0<x<1$ and $n=2$ to 40) is employed instead of the second $In_xGa_{1-x}P$ ($0<x<1$) layer 7. The layer 10 inhibits transmission of crystalline dislocation providing for InP layers of higher quality.

Each layer can be formed by a Molecular Beam Epitaxy (MBE) method, an Organic Metal Vapor Phase Epitaxy (MOVPE) method, a Halide-Vapor Phase Epitaxy method (Halide-VPE and the like. The MOVPE method is employed as one example for the following explanation of FIG. 4.

The MOVOE is carried out using a low pressure MOVPE apparatus the reaction tube of which has a low pressure of 25 to 100 Torr. It is also carried out at atmospheric pressure.

The Si substrate 5 is cleaned in an HF solution and heat-treated in a $AsH_3+H_2$ atmosphere at 1,000° C. for 5 to 10 minutes. The substrate is cooled to 350° to 400° C. at which a GaAs layer is formed in a thickness of 10 to 20 nm. It was then heated to 550° to 650° C. at which a GaAs layer is formed thereon in a thickness of 10 to 200 nm to obtained the intermediate layer 9. The resultant substrate is cooled to 400° C. at which an InP layer is formed in 10 to 20 nm, and heated to 550° to 650 ° C. at which another InP layer is formed thereon in a thickness of 10 to 3,000 nm to obtain the InP layer (the first semiconductor layer) 6. On the obtained substrate, an $In_xGa_{1-x}P$ ($0<x<1$) layer and an InP layer, each layer of which has a thickness of 2.5 to 1,000 nm, are alternatively formed until 2 to 40 layers with keeping at 550° to 650° C. to obtain the $(InP/In_xGa_{1-x}P) \times n$ (the second semiconductor) layer 10. Then, another InP layer is formed thereon in a thickness of 2 to 5 micrometer to obtain the InP (the third semiconductor) layer 8.

A feed gas for the GaAs layer 9 is triethylgallium and arsine ($AsH_3$), for the InP layer 6, 8, 10 is trimethylindium and phosphine and for the $In_xGa_{1-x}P$ layer 7, 10 is trimethylindium, triethylgallium and phosphine. In the formation of the GaAs layer, triethylgallium is fed in an amount of $2.5 \times 10^{-5}$ mol % and a feed amount ratio of $AsH_3$/triethylgallium is 100 to 200. In the InP layer, phosphine is fed in an amount of 2.5 to $5.6 \times 10^{-5}$ mol % and a feed amount ratio of phosphine/trimethylindium is 200 to 1,200. In the $In_xGa_{1-x}P$ layer, when x is 5, triethylgallium and trimethylindium are respectively fed in an amount of $5.6 \times 10^{-5}$ mol % and a feed amount ratio of phosphine/triethylgallium+trimethylindium is 200. The above feed gases are generally diluted with $H_2$ gas and a total flow amount in the reaction tube is set 15 l/min.

The obtained substrate has a smooth (specular) InP layer surface. The InP layer has substantially no cracks, which show that there is little residual stress in the InP layer. According to a measurement of photoluminescense at 77° K. peak shift amount is 1 to 3 meV and the distance of split is less than 3 meV, which is 3 meV smaller than the conventional substrate which does not have the second layer 3, 7 and 10. This shows that the residual stress is reduced 50% in the InP epitaxial layer, according to the discussion of J. Asai and K. Oe: J. Appl. Phys. 54 (1983) 2052, and A. Yamamoto, N. Uchida and M. Yamaguchi: Optoelectronics Devices and Technologies 1 (1986) 41. The obtained substrate is etched with an $HBr + H_3PO_4$ solution, but the density of etch pits is 1 to $5 \times 10^7$ number $cm^{-2}$, which smaller than a conventional one which does not have the second layer 7 and 10. Thus, it is found that the insertion of the second layer 7 and 10 is very effective in producing an InP layer having high quality and substantially no lattice defects.

As a typical example, a Si substrate 5 [(100) 3° off toward $<110>$] having a thickness of 525 micrometer was heat-treated in an $H_2$ atmosphere containing $PH_3$ at 0.015 Torr at 1,000° C. A GaAs layer having 100 angstrom was formed thereon and then heated to 550° C. at which time another GaAs layer is formed at a thickness of 1,000 angstrom to obtain a GaAs intermediate layer 9. Next, at 400° C., an InP layer was formed thereon and then heated to 625° C. at which time another InP layer is formed at a thickness of 4 micrometers to obtain a first InP layer 6. At 625° C., a 10 nm InP layer and a 10 nm $In_{0.5}Ga_{0.5}P$ layer are alternatively formed as 7 layers to obtain a strain super lattice layer 10. Then, an InP layer (the third layer) is formed at a thickness of 1 micrometer. The obtained InP layer had a peak shift amount of 1 meV and a distance of split of 3 meV. It also had a lattice defect of $5 \times 10^7$ number $cm^{-2}$.

What is claimed is:

1. A compound semiconductor substrate comprising:
   (a) a Si substrate;
   (b) a first semiconductor layer of InP formed on the substrate,
   (c) a second semiconductor layer of $In_xGa_{1-x}P$ ($0<x<1$) having such a lattice constant as to produce a stress in a direction opposite to the stress which occurs during the time of forming said first semiconductor layer due to a difference of thermal expansion coefficient between said substrate and said first semiconductor layer, formed on said first semiconductor layer, and
   (d) a third semiconductor layer of InP formed on said second semiconductor layer.

2. The compound semiconductor substrate according to claim 1, wherein an intermediate layer of GaAs is disposed between said substrate of Si and said first semiconductor layer of InP.

3. A compound semiconductor substrate comprising:
(a) a Si substrate;
(b) a first semiconductor layer of InP formed on the substrate, p1 (c) a second semiconductor layer, formed on said first semiconductor layer, which is composed of at least two layers, one of which is a layer of $In_xGa_{1-x}P$ ($0<x<1$) and the other of which is a layer of InP, said second semiconductor layer having such a lattice constant as to produce a stress in a direction opposite to the stress which occurs during the time of forming said first semiconductor layer due to a difference of thermal expansion coefficient between said substrate and said first semiconductor layer and
(d) a third semiconductor layer of InP formed on said second semiconductor layer.

4. The compound semiconductor substrate according to claim 3, wherein an intermediate layer of GaAs is disposed between said substrate of Si and said first semiconductor layer of InP.

5. The compound semiconductor substrate according to claim 3, wherein said second semiconductor layer comprises a super lattice layer of $(InP/In_xGa_{1-x}P)_n$, wherein $0<x<1$ and $n=2$ to 40.

6. The compound semiconductor substrate according to claim 4, wherein said second semiconductor layer comprises a super lattice layer of $(InP/In_xGa_{1-x}P)_n$, wherein $0<x<1$ and $n=2$ to 40.

* * * * *